United States Patent
Li et al.

(10) Patent No.: US 10,886,492 B2
(45) Date of Patent: Jan. 5, 2021

(54) ARRAY SUBSTRATE AND DISPLAY PANEL COMPRISING FRACTURE OPENING FOR BLOCKING CARRIER TRANSPORTATION BETWEEN ADJACENT SUB-PIXELS

(71) Applicant: BOE TECHNOLOGY GROUP CO., LTD., Beijing (CN)

(72) Inventors: Xiaohu Li, Beijing (CN); Zhiqiang Jiao, Beijing (CN); Tun Liu, Beijing (CN); Huajie Yan, Beijing (CN); Hongsheng Zhan, Beijing (CN); Liangliang Kang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/400,619

(22) Filed: May 1, 2019

(65) Prior Publication Data
US 2019/0363276 A1  Nov. 28, 2019

(30) Foreign Application Priority Data

May 23, 2018 (CN) .......................... 2018 1 0502871

(51) Int. Cl.
*H01L 51/50* (2006.01)
*H01L 27/32* (2006.01)
(Continued)

(52) U.S. Cl.
CPC ...... *H01L 51/5088* (2013.01); *H01L 27/3211* (2013.01); *H01L 51/5056* (2013.01);
(Continued)

(58) Field of Classification Search
CPC ......... H01L 2251/5392; H01L 51/5056; H01L 51/5088
See application file for complete search history.

(56) References Cited

U.S. PATENT DOCUMENTS

2009/0294778 A1    12/2009  Mitsuya
2017/0117337 A1*    4/2017  Kimura ............... H01L 51/5246
(Continued)

FOREIGN PATENT DOCUMENTS

CN    105097830 A    11/2015
CN    105552107 A     5/2016
(Continued)

OTHER PUBLICATIONS

Chinese Office Action in Chinese Application No. 201810502871.1, dated Mar. 3, 2020 with English translation.
(Continued)

*Primary Examiner* — Daniel Whalen
(74) *Attorney, Agent, or Firm* — Collard & Roe, P.C.

(57) ABSTRACT

An array substrate and a manufacturing method thereof, and a display panel are disclosed. The array substrate includes a base substrate, comprising a plurality of sub-pixel regions and inter-sub-pixel regions between adjacent sub-pixel regions; and a first organic functional layer on the base substrate. At least a portion of the first organic functional layer is in the plurality of sub-pixel regions; and the first organic functional layer includes at least one fracture opening, the at least one fracture opening is configured to block a transportation of the carriers between adjacent sub-pixel regions.

15 Claims, 7 Drawing Sheets

(51) Int. Cl.
*H01L 51/56* (2006.01)
*H01L 51/52* (2006.01)

(52) U.S. Cl.
CPC ...... *H01L 51/5072* (2013.01); *H01L 51/5092* (2013.01); *H01L 51/56* (2013.01); *H01L 51/5218* (2013.01); *H01L 2251/5315* (2013.01); *H01L 2251/558* (2013.01)

(56) References Cited

U.S. PATENT DOCUMENTS

| | | |
|---|---|---|
| 2017/0141341 A1 | 5/2017 | Liao et al. |
| 2017/0250236 A1 | 8/2017 | Xiong et al. |
| 2018/0337222 A1 | 11/2018 | Wang et al. |
| 2019/0115561 A1* | 4/2019 | Tang .................. H01L 51/5228 |

FOREIGN PATENT DOCUMENTS

| | | |
|---|---|---|
| CN | 107104129 A | 8/2017 |
| CN | 107240599 A | 10/2017 |
| CN | 107359263 A | 11/2017 |
| CN | 107785381 A | 3/2018 |
| CN | 107968106 A | 4/2018 |

OTHER PUBLICATIONS

Chinese Office Action in Chinese Application No. 201810502871.1, dated Jul. 29, 2020 with English translation.

* cited by examiner

ARRAY SUBSTRATE AND DISPLAY PANEL COMPRISING FRACTURE OPENING FOR BLOCKING CARRIER TRANSPORTATION BETWEEN ADJACENT SUB-PIXELS

The application claims priority to the Chinese patent application No. 201810502871.1, filed May 23, 2018, the entire disclosure of which is incorporated herein by reference as part of the present application.

TECHNICAL FIELD

Embodiments of the present disclosure relate to an array substrate and a manufacturing method thereof, and a display panel.

BACKGROUND

Organic light emitting diode display panels have advantages such as self-luminescence, fast response, wide viewing angle, high brightness, rich colors, thinness and therefore, the technology for the organic light emitting diode display devices becomes an important display technology. For example, the organic light emitting diode display panel comprises a plurality of sub-pixels which are arranged in an array, and each of the sub-pixels normally comprises structures such as an organic light emitting element and a thin film transistor. The organic light emitting element, for example, comprises structures such as an anode, a cathode and a light-emitting layer between the anode and the cathode. For example, the organic light emitting elements may further comprises at least one film layer from a hole injection layer, a hole transport layer, an electron injection layer, an electron transport layer, and so on.

SUMMARY

At least one embodiment of the disclosure provides an array substrate, comprising: a base substrate, comprising a plurality of sub-pixel regions and inter-sub-pixel regions between adjacent sub-pixel regions; and a first organic functional layer on the base substrate; wherein at least a portion of the first organic functional layer is in the plurality of sub-pixel regions; and the first organic functional layer comprises at least one fracture opening, the at least one fracture opening is configured to block a transportation of the carriers between adjacent sub-pixel regions.

In some examples, the first organic functional layer is further in the inter-sub-pixel regions, and a part of the first organic functional layer in the inter-sub-pixel regions is a continuous layer, and the part of the first organic functional layer is integral with another part of the first organic functional layer in the sub-pixel regions.

In some examples, an organic light emitting element is provided in each of the sub-pixel regions; and the organic light emitting element comprises: an electrode layer on the base substrate, the electrode layers of adjacent sub-pixels are spaced apart from each other, the first organic functional layer is provided at a side of the electrode layer away from the base substrate in the sub-pixel regions and in inter-sub-pixel regions, the fracture opening is located in the sub-pixel regions.

In some examples, a surface of the electrode layer comprises a groove, an orthographic projection of the groove on the base substrate coincide with an orthographic projection of the at least one fracture opening on the base substrate.

In some examples, an orthographic projection of the groove on the base substrate comprises a ring-shape or a stripe-shape.

In some examples, the ring-shape comprises an enclosed ring-shape.

In some examples, a width of the groove in a direction perpendicular to an extending direction of the groove is in a range from 1 micron to 5 microns.

In some examples, a bottom of the groove comprises a material layer, the material layer has a same material as that of the first organic functional layer, and the material layer is spaced apart from the portions of the first organic functional layer at two sides of the fracture opening.

In some examples, a void is provided in the groove.

In some examples, a depth of the groove in a direction perpendicular to the base substrate is greater than a thickness of the first organic functional layer in the direction perpendicular to the base substrate.

In some examples, the array substrate further comprises a second organic functional layer, wherein the second organic functional layer is formed at a side of the first organic functional layer away from the electrode layer and is continuously distributed at the groove; and the first organic functional layer has a carrier mobility greater than that of the second organic functional layer.

In some examples, the first organic functional layer and the second organic functional layer are shared by the plurality of sub-pixels.

In some examples, the organic light emitting element further comprises a light-emitting layer at a side of the second organic functional layer away from the first organic functional layer, and an opposed electrode layer at a side of the light-emitting layer away from the second organic functional layer.

In some examples, the light-emitting layers of adjacent sub-pixels are spaced apart from each other.

In some examples, the first organic functional layer comprises a hole injection layer.

At least one embodiment of the disclosure provides a display panel, comprising the array substrate as mentioned above.

At least one embodiment of the disclosure provides a manufacturing method of an array substrate, comprising: providing a base substrate; depositing a film for an electrode layer on the base substrate, and forming a plurality of electrode layers spaced apart from each other through patterning the film for the electrode layer; forming an organic functional layer on the base substrate formed with the plurality of electrode layers, the organic functional layer comprising a fracture opening in a region where each electrode layer is located to separate portions of the organic functional layer at two sides of the fracture opening.

In some examples, the method further comprises: before forming the organic functional layer, forming a groove at a surface of each of the electrode layers, wherein a material for forming the organic functional layer is formed on the electrode layers and at a region between adjacent electrode layers, so as to form the fracture opening at the groove.

In some examples, the groove is formed at a periphery portion of each of the electrode layers and extends along an edge of each of the electrode layers, and a planar shape of the groove comprises a ring-shape or a stripe-shape.

In some examples, a depth of the groove in a direction perpendicular to the base substrate is greater than a thickness of the first organic functional layer in the direction perpendicular to the base substrate.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An organic light emitting diode display panel comprises a plurality of sub-pixels arranged in an array, each of the sub-pixels normally comprises structures such as an organic light emitting element and a thin film transistor. For example, the organic light emitting element normally comprises structures such as an anode, a cathode and a light-emitting layer between the anode and the cathode, the holes which are injected from the anode and the electrons which are injected from the cathode are combined in the light-emitting layer to generate excitons, so as to allow the light-emitting layer to emit light. For example, the organic light emitting element normally further comprises an organic functional film layer such as a hole injection layer. For example, during fabricating the organic light emitting element, the hole injection layer is normally formed by an evaporation method. For example, in the organic light emitting diode display panel, the plurality of sub-pixels in each pixel normally share one hole injection layer, and by allowing the hole injection layer to be a layer shared by the plurality of sub-pixels, the fabrication processes can be simplified, and the fabrication cost can be reduced.

Figure 1:
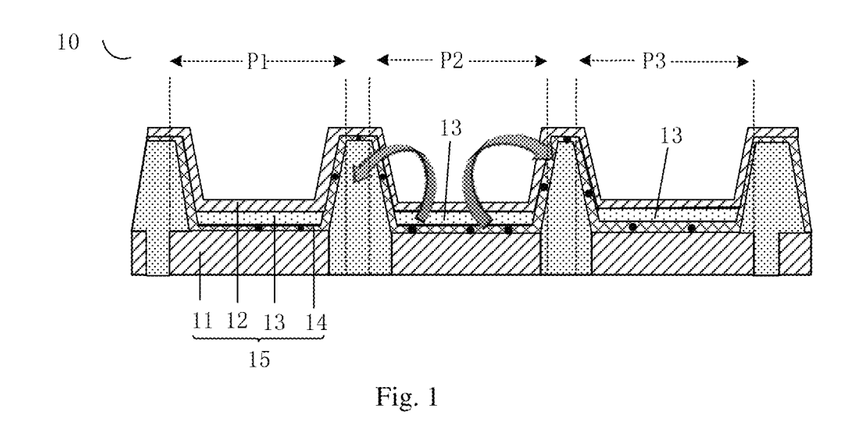
FIG. 1 is a diagram illustrating a cross-sectional structure of an array substrate.

For example, FIG. 1 illustrates a schematic cross-sectional structural view of part of an array substrate 10, as illustrated in FIG. 1, each pixel of the array substrate 10 comprises three sub-pixels P1, P2 and P3, each of the sub-pixels comprises an organic light emitting element 15. As illustrated in FIG. 1, the organic light emitting element 15 comprises structures such as an anode 11, a cathode 12, a light-emitting layer 13 and a hole injection layer 14. The hole injection layer 14 is a continuous film layer in each of the sub-pixels and at a region between adjacent sub-pixels, that is to say, the organic light emitting elements of the three sub-pixels share the hole injection layer 14. For example, as illustrated in FIG. 1, the light-emitting layer 13 in the first sub-pixel P1 may be a red light-emitting layer, the light-emitting layer 13 in the second sub-pixel P2 may be a green light-emitting layer, and the light-emitting layer 13 in the third sub-pixel P3 may be a blue light-emitting layer.

For example, as illustrated in FIG. 1, in the case where a voltage is applied to the second sub-pixel P2 while no voltage is applied to the first sub-pixel P1 and the third sub-pixel P3, theoretically, only the light-emitting layer 13 of the second sub-pixel P2 emits green light, and the light-emitting layers of the first sub-pixel P1 and the third sub-pixel P3 emit no light. However, because the lateral transportation speed of the carriers (the black circular dot in the hole injection layer 14 as illustrated in FIG. 1) of the hole injection layer 14 is normally high, under the action of voltage difference, the carriers of the hole injection layer 14 in the second sub-pixels P2 may be laterally transported into the hole injection layer 14 in the first sub-pixels P1 and in the third sub-pixels P3, which are adjacent to the hole injection layer 14 in the second sub-pixels P2, which causes that the light-emitting layer 13 in the first sub-pixels P1 emits red light, and causes that the light-emitting layer 13 in the third sub-pixels P3 emits blue light. In the case where a user watches a display panel including the array substrate at the viewing side of the display panel, the user may see the light emitted by the green sub-pixel, the red sub-pixel and the blue sub-pixel, and the problem may even severe for high resolution display panels. The lateral transportation of the carriers of the hole injection layer between adjacent sub-pixels causes undesired phenomenon such as color crosstalk and reduction in contrast ratio in the display panel and causes the display panel to be unable to satisfy normal display requirements, and therefore, the display effect is adversely affected.

Figure 2:
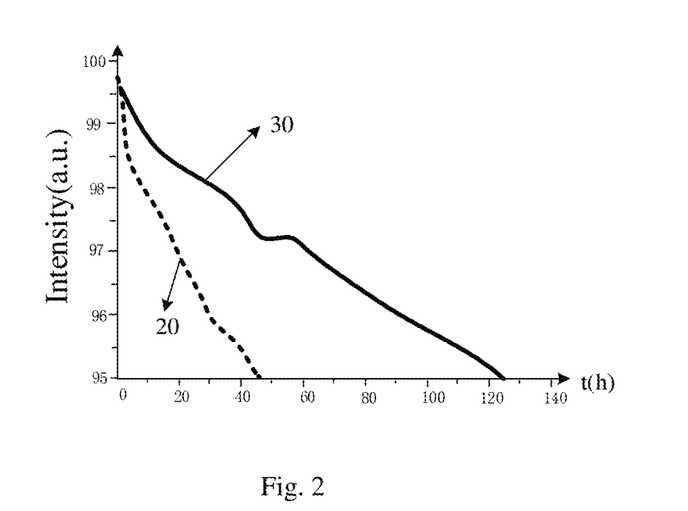
FIG. 2 is a diagram illustrating life-span curves of two organic light emitting elements.

For example, a surface of the anode normally comprises protrusions with unevenness, and accumulation of charges easily occurs around the protrusions, such that point discharge can be caused and the life span of the organic light emitting element can be reduced. By increasing the thickness of the hole injection layer, the flatness of the surface of the anode below the hole injection layer can be increased, and the point discharge caused by accumulation of charges can be effectively decreased, such that the life span of the organic light emitting element including the hole injection layer can be prolonged to some extent, FIG. 2 is a schematic diagram illustrating a comparison result of life spans of two organic light emitting elements. As illustrated in FIG. 2, the dash line represents a simulated life span of the organic light emitting element 20 including a hole injection layer with thickness being equal to about 10 nm, and the solid line represents a simulated life span of the organic light emitting element 30 including a hole injection layer with thickness being equal to about 50 nm. It can be seen from FIG. 2, the life span of the organic light emitting element 20 is close to 50 hours, and the life span of the organic light emitting element 30 is approximately 125 hours, the life span of the organic light emitting elements 30 is greater than the life span of the organic light emitting elements 20, and therefore, increasing of the thickness of the hole injection layer is in favor of prolonging the life span of the organic light emitting element. However, the lateral mobility of the carriers of the hole injection layer may be increased accordingly when the thickness of the hole injection layer is increased, and this can cause undesired phenomenon such as color crosstalk and reduction in contrast ratio in the display panel even more critical, and the display effect of the display panel can be adversely affected even more.

It should be noted that, "the life span of the organic light emitting element 20 is close to 50 hours" and "the life span of the organic light emitting element 30 is approximately 125 hours" does not limit the actual life span of the organic light emitting element 20 and the organic light emitting element 30, and the test results of the simulated experiment are intended to compare the influence of the hole injection layers with different thicknesses on the life spans of the organic light emitting elements.

At least one embodiment of the present disclosure provides an array substrate, and the array substrate comprises a base substrate and a plurality of sub-pixels on the base substrate. Each of the sub-pixels comprises an organic light emitting element; and the organic light emitting element comprises: an electrode layer and a first organic functional layer. The electrode layer is on the base substrate and within each of the sub-pixel, the electrode layers of adjacent sub-pixels are spaced apart from each other; the first organic functional layer is provided at a side, which is away from the base substrate, of the electrode layer and at a region between adjacent sub-pixels. The first organic functional layer comprises a fracture opening in a region where the electrode layer is located, so as to separate portions of the first organic functional layer at two sides of the fracture opening.

In the array substrate provided by at least one embodiment of the present disclosure, the first organic functional layer comprises the fracture opening in the region covering the electrode layer of each sub-pixel, so as to separate the portions, which are at two sides of the fracture opening, of the first organic functional layer, and allow the lateral transportation of the carriers of the first organic functional layer between adjacent sub-pixels to be blocked. The array substrate can alleviate undesired phenomenon such as the cross-color and reduction in contrast ratio of the display panel and can improve the display effect of the display panel. Further, the array substrate is also in favor of increasing the thickness of the hole injection layer and prolonging the life span of the organic light emitting element.

The present disclosure is described in the following with reference to a plurality of embodiments. For the sake of keeping the following descriptions of the embodiments of the present disclosure to be clear and concise, detailed descriptions regarding known functions and known components may be omitted. In the case where any component in the embodiments of the present disclosure is presented in more than one accompanying drawings, the component in each accompanying drawings adopts same character reference.

Figure 3:
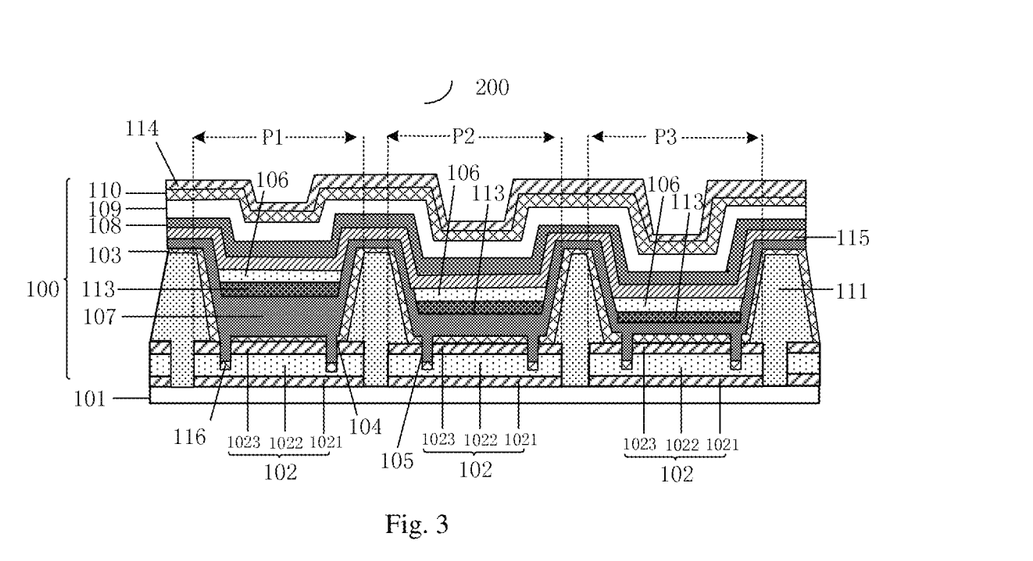
FIG. 3 is a diagram illustrating cross-sectional structure of an array substrate provided by an embodiment of the present disclosure.

The present embodiment provides an array substrate 200, and FIG. 3 is a schematic cross-sectional structural view of part of the array substrate 200. As illustrated in FIG. 3, the array substrate 200 comprises a base substrate 101 and a plurality of sub-pixels P1, P2 and P3 on the base substrate 101, each of the sub-pixels comprises an organic light emitting element 100. It should be noted that, FIG. 3 only illustrates a schematic cross-sectional structural view of three adjacent sub-pixels of the array substrate 200, the three sub-pixels, for example, may be three sub-pixels in one pixel of the array substrate 200, but the present embodiment are not limited to this case. For example, as illustrated in FIG. 3, the organic light emitting element 100 comprises an electrode layer 102 and a first organic functional layer 103, and the first organic functional layer 103 is on the electrode layer 102 and at the region between adjacent sub-pixels. For example, during forming the first organic functional layer 103, the material for forming the first organic functional layer 103 may be formed on the entire region of the display area through an evaporation method, so as to form a functional layer shared by the plurality of sub-pixels. The region, which covers the electrode layer 102, of the first organic functional layer 103 comprises a fracture opening 104, so as to separate the portions, which are at two sides of the fracture opening 104, of the first organic functional layer 103. For example, the first organic functional layer 103 comprises a portion at the side of the electrode layer 102 away from the base substrate 101, and a portion between adjacent electrode layers 102. Here, the portion at the side of the electrode layer 102 away from the base substrate 101 refers to the portion of the first organic functional layer 103 provided at the region where the electrode layer 102 locates. That is to say, the orthographic projection of the portion of the first organic functional layer 103 provided at the region where the electrode layer 102 locates and the orthographic projection of the electrode layer 102 on the base substrate overlap with each other. For example, the above-mentioned fracture opening 104 is formed in the portion of the first organic functional layer 103 provided at the region where the electrode layer 102 locates.

For example, as illustrated in FIG. 3, the base substrate 101 may be a quartz substrate, a glass substrate, a plastic substrate or a substrate made of any suitable material, and no specific limitation will be given in the present embodiment in this respect. For example, in an example, the base substrate 101 may also be a flexible base substrate, and the flexible base substrate 101, for example, is bendable and allows light to pass through. Examples of the materials of the flexible base substrate 10 comprise at least one or any combination of polyimide, polycarbonate, polyethylene, polyacrylate.

For example, as illustrated in FIG. 3, the electrode layer 102 of the organic light emitting element 100 is on the base substrate 101 within each of the sub-pixels of the array substrate 200, and the electrode layers 102 in adjacent sub-pixels are spaced apart from each other. For example, as illustrated in FIG. 3, the electrode layers 102 are respectively provided in the first sub-pixel P1, the second sub-pixel P2 and the third sub-pixel P3 of the array substrate 200, and the electrode layers 102 in adjacent sub-pixels are spaced apart from each other through a pixel definition layer 111. For example, in an example, the electrode layer 102 may serve as the anode of the organic light emitting element 100. For example, as illustrated in FIG. 3, the electrode layer 102 comprises at least two sub-electrode layers sequentially laminated. The descriptions of the present embodiment is given by taking the case where the electrode layer 102 comprises three sub-electrode layers as an example, but the present embodiment is not limited to this case, the layers of the sub-electrode layers of the electrode layer 102 may be adjusted accordingly according to the requirements in designing a product. For example, as illustrated in FIG. 3, the electrode layer 102 comprises a first sub-electrode layer 1021, a second sub-electrode layer 1022 and a third sub-electrode layer 1023 which are sequentially laminated on the base substrate 101, and examples of the materials of the first sub-electrode layer 1021 and the third sub-electrode layer 1023 comprises transparent conductive oxide, and the transparent conductive oxide, for example, comprises indium zinc oxide (IZO), indium tin oxide (ITO) and other suitable materials; examples of the materials of the second sub-electrode layer 1022 comprises a metal material, and the metal material, for example, comprises silver, copper, aluminum, chromium, molybdenum, titanium, silver alloy, copper alloy, aluminum neodymium alloy, copper-molybdenum alloy, molybdenum-tantalum alloy, molybdenum-neodymium alloy or any combination of the above-mentioned metal materials. The second sub-electrode layer 1022 which is made of a metal material has good reflectivity, ductility and conductivity. For example, in an example, the array substrate 200 is a top emission type OLED array substrate, in the case where the light emitted by the organic light-emitting layer is incident on the second sub-electrode layer 1022, the second sub-electrode layer 1022 which is made of a metal material may reflect the light emitted by the organic light-emitting layer, such that the utilization rate of the light can be increased. The first sub-electrode layer 1021 below the second sub-electrode layer 1022 may increase the adhesion of the second sub-electrode layer 1022 to the base substrate 101; meanwhile, the third sub-electrode layer 1023 above the second sub-electrode layer 1022 may prevent the second sub-electrode layer 1022 from being oxidized. In addition, the third sub-electrode layer 1023 normally has high work function, and the third sub-electrode layer 1023 with high work function may be in favor of injecting the holes into a corresponding functional film layer. The electrode layer 102 formed with the first sub-electrode layer 1021, the second sub-electrode layer 1022 and the third sub-electrode layer 1023 has good reflectivity, ductility and conductivity, and problems such as insufficient adhesion to the base substrate 101 and insufficient antioxidant capacity does not exist.

For example, as illustrated in FIG. 3, the surface, which faces toward the first organic functional layer 103, of the electrode layer 102 is provided with a groove 105, the groove 105 penetrates at least one sub-electrode layer at the side, which is away from the base substrate 101, of the electrode layer 102, the embodiment as illustrated by FIG. 3 is described by taking the case where the groove 105 penetrates the third sub-electrode layer 1023 and the second sub-electrode layer 1022 as an example, but the present embodiment is not limited to this case. The groove 105 formed on the electrode layer 102 may allow a fracture opening 104 to be automatically formed at the region, which covers the groove 105, of the first organic functional layer 103 when forming the first organic functional layer 103 through an evaporation method.

Figure 4A:
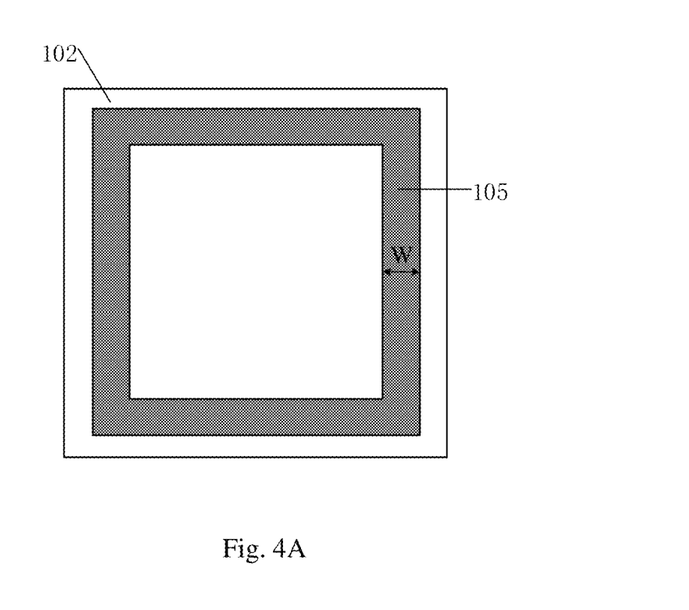
FIG. 4A-FIG. 4D are schematic structural plan views of a groove.

FIG. 4A is a schematic structural plan view of the groove 105, refer to FIG. 3 and FIG. 4A, the groove 105 is at the periphery portion of the electrode layer 102 in each of the sub-pixels and extends along the edge of the electrode layer 102, and the planar shape of the groove 105 is an enclosed ring-shape. For example, as illustrated in FIG. 3 and FIG. 4A, in a direction parallel to the array substrate 200, the groove 104 surrounds the periphery of the electrode layer 102 and is close to the edge of the electrode layer 102, such that the lateral transportation, between adjacent sub-pixels, of the carriers of the first organic functional layer 103 on the electrode layer 102 can be obstructed with relatively good effect. For example, as illustrated in FIG. 4A, in an example, in the direction perpendicular to the extension direction of the groove 105, the width W (the width illustrated by the arrow in FIG. 4A) of the groove 105 is about in a range from 1 μm to 5 μm, but the present embodiment is not limited to this case. For example, as illustrated in FIG. 3, in the direction perpendicular to the array substrate 200, the depth of the groove 105 in the electrode layer 102 is greater than the thickness of the first organic functional layer 103, and therefore, the first organic functional layer 103 can form the fracture opening 104 at the groove 105, so as to allow the portions, which are at two sides of the fracture opening 104, of the first organic functional layer 103 to be spaced apart from each other. For example, in an example, in the direction perpendicular to the array substrate 200, the depth of the groove 105 is about in a range from 20 nm to 90 nm, but the present embodiment is not limited to this case. For example, the depth of the groove 105 may be set to allow the first organic functional layer 103 to be fractured at the groove 105, and to allow the subsequent film layers formed on the first organic functional layer 103 to be not fractured at the position corresponding to the groove 105.

It should be noted that, the present embodiment is described by the case where the surface of the electrode layer 102 is provided with one enclosed ring-shape groove 105 as an example, but the present embodiment is not limited to this case. For example, according to demands, the surface of the electrode layer 102 may also be provided with two or a plurality of enclosed ring-shape grooves 105, and no specific limitation will be given in the present embodiment in this respect.

Figure 4B:
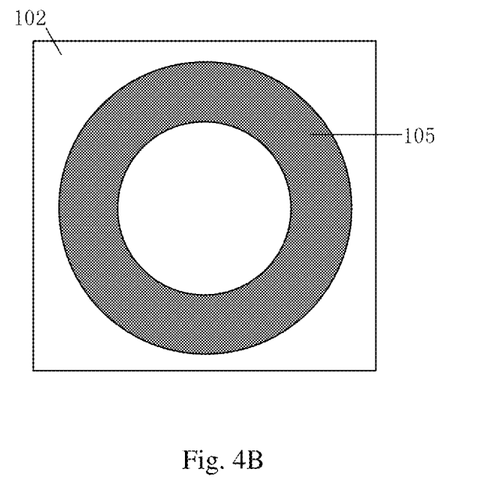
Figure 4C:
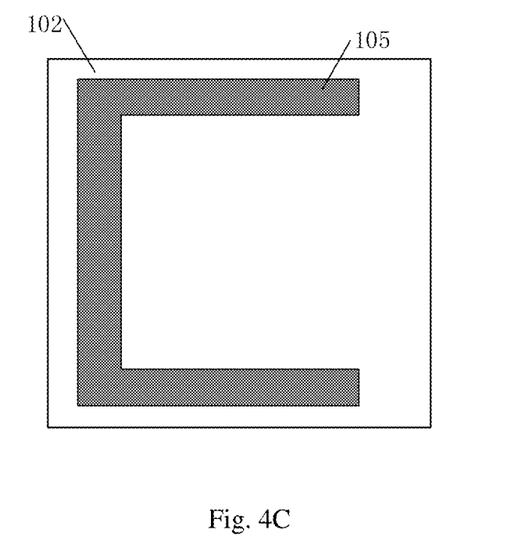
Figure 4D:
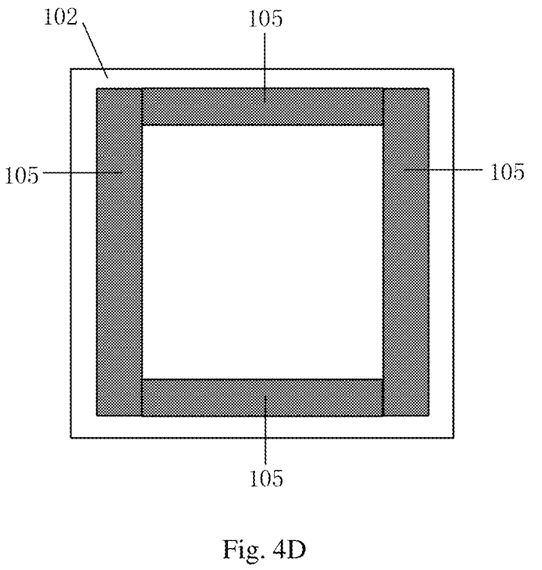

It should be noted that, the planar shape of the groove 105 may be a ring-shape, a stripe-shape or any other suitable shape, and the ring-shape may be an enclosed ring-shape or an unenclosed ring-shape. For example, the planar shape of the groove 105 as illustrated in FIG. 4A may be an enclosed rectangular ring, but the present embodiment is not limited to this case. For example, as illustrated in FIG. 4B, in an example, the planar shape of the groove 105 may also be an enclosed circular ring; or, as illustrated in FIG. 4C, in another example, the planar shape of the groove 105 may also be a ring-shape with an opening, and the size of the opening of the ring-shape may be adjusted accordingly according to product design demands, and no specific limitation will be given in the present embodiment in this respect. For example, as illustrated in FIG. 4D, in further another example, the planar shape of the groove 105 may also be a stripe-type, a plurality of grooves 105 in a stripe-type are at the periphery of the electrode layer 102 in each of the sub-pixels, and extend along the edge of the electrode layer 102, such that lateral transportation, between adjacent sub-pixels, of the carriers of the first organic functional layer 103 on the electrode layer 102 is obstructed.

For example, as illustrated in FIG. 3, the first organic functional layer 103 is on the electrode layer 102 and at the region between adjacent sub-pixels, in the region corresponding to the electrode layer 102 in each of the sub-pixels, the first organic functional layer 103 comprises the fracture opening 104, so as to separate the portions, which are at two sides of the fracture opening 104, of the first organic functional layer 103. For example, FIG. 3 illustrates three adjacent sub-pixels of the array substrate 200, the three sub-pixels may be three sub-pixels in one pixel of the array substrate 200, the organic light emitting elements of the three sub-pixels may share the first organic functional layer 103. Obviously, the present embodiment is not limited to this case. For example, in another example, the organic light emitting elements of all of the sub-pixels of the array substrate 200 share the first organic functional layer 103. The first organic functional layer 103, for example, may be any suitable organic film layers of the organic light emitting element 100, and no limitation will be given to the present embodiment in this respect, the present embodiment is described by the case where the first organic functional layer 103 is a hole injection layer as an example.

For example, as illustrated in FIG. 3, the fracture opening 104 of the hole injection layer 103 is at the groove 105, that is, the orthographic projection of the fracture opening 104 of the hole injection layer 103 on the base substrate 101 at least partially overlaps the orthographic projection of the groove 105 on the base substrate 101. Because the depth of the groove 105 in the direction perpendicular to the base substrate 101 is greater than the thickness of the hole injection layer 103 in the direction perpendicular to the base substrate 101, part of the material 116 for forming the hole injection layer 103 may be formed at the bottom of the groove 105 when forming the hole injection layer 103, so as to allow a fracture to be occurred at the groove 105, and block the lateral transportation of the carriers of the hole injection layer 103 between adjacent sub-pixels. For example, the hole injection layer 103 comprises the hole injection material, the hole injection material, for example, comprises at least one of copper phthalocyanine and polyaniline.

For example, as illustrated in FIG. 3, in an example, the organic light emitting element 100 further comprises a second organic functional layer 107, the second organic functional layer 107 is on the hole injection layer 103, and the second organic functional layer 107, for example, may be a hole transport layer. Because the depth of the groove 105 in the direction perpendicular to the base substrate 101 is greater than the thickness of the hole injection layer 103 in the direction perpendicular to the base substrate 101, the material 116 of the hole injection layer in the groove 105 is at the bottom of the groove 105 and is unable to completely fill the groove 105. For example, when forming the hole transport layer 107 on the hole injection layer 103 through an evaporation, a part of the hole transport layer 107 may also be formed in the groove 105, and on the material 116 of the hole injection layer in the groove. For example, the hole transport layer 107 is continuously distributed at the groove 105. For example, the hole transport layer 107 is a continuous film layer on the hole injection layer 103 and at the region between adjacent sub-pixels. For example, the mobility of the carriers of the hole injection layer 103 is greater than the mobility of the carriers of the hole transport layer 107. For example, it is schematically illustrated in FIG. 3 that the hole injection layer 107 has different thicknesses in different sub-pixels, however, the embodiments of the present disclosure are not limited thereto, and the hole injection layer 107 may have the same or different thicknesses in different sub-pixels.

For example, similar to the first organic functional layer 103, the second organic functional layer 107 is shared by the plurality of sub-pixels. However, because the mobility of the carriers of the second organic functional layer 107 is less than the mobility of the carriers of the first organic functional layer 103, the cross-color between adjacent sub-pixels is not apparent even when the second organic functional layer 107 do not have an fracture opening at the region where the electrode layer 102 is located.

For example, as illustrated in FIG. 3, in another example, the organic light emitting element 100 further comprises structures such a light-emitting layer 106, an electron transport layer 108, an electron injection layer 109 and an opposed electrode 110 on the hole transport layer 107. For example, in the present embodiment, the electrode layer 102 is configured to be the anode of the organic light emitting element 100, the opposed electrode 110 is configured to be the cathode of the organic light emitting element 100. The light-emitting layer 106 is in each of the sub-pixels of the array substrate 200, the light-emitting layers 106 in adjacent sub-pixels are spaced apart from each other. For example, as illustrated in FIG. 3, the color of the light emitted by the light-emitting layer 106 in the first sub-pixel P1, the color of the light emitted by the light-emitting layer 106 in the second sub-pixel P2, and the color of the light emitted by the light-emitting layer 106 in the third sub-pixel P3 may be same or different. For example, in an example, the light-emitting layer 106 in the first sub-pixel P1 is a red light-emitting layer, the light-emitting layer 106 in the second sub-pixel P2 is a green light-emitting layer, and the light-emitting layer 106 in the third sub-pixel P3 is a the blue light-emitting layer, such that the display panel including the array substrate 200 can realize color display. The electron transport layer 108 and the electron injection layer 109 may adopt a conventional or known material, and no further description will be given in the present embodiment here. For example, the light-emitting layer of each of the sub-pixels and the light-emitting layer of the sub-pixels adjacent to the each of the sub-pixels are separated. For example, the light-emitting layers of the plurality of sub-pixels and the electrode layers of the plurality of sub-pixels are arranged to be in one-to-one correspondence. For example, the opposed electrodes 110 may be the common electrodes of the plurality of sub-pixels, but the embodiments of the present disclosure are not limited to this case.

For example, as illustrated in FIG. 3, in another example, the organic light emitting element 100 may further comprises structures such as a hole blocking layer 113, an optical adjustment layer 114 and an electron blocking layer 115. For example, the hole blocking layer 113 is between the hole transport layer 107 and the light-emitting layer 106, and the electron blocking layer 115 is between the electron transport layer 108 and the light-emitting layer 106.

It should be noted that, in the present embodiment, the electrode layer 102 is configured to be the anode of the organic light emitting element 100, and the opposed electrode 110 is configured to be the cathode of the organic light emitting element 100, but the present embodiment is not limited to this case. For example, in another example, the electrode layer 102 is configured to be the cathode of the organic light emitting element 100, and the opposed electrode 110 is configured to be the anode of the organic light emitting element 100. In this case, structures such as the electrode layer 102, the electron injection layer 103, the electron transport layer 107, the hole transport layer 108 and the hole injection layer 109 are sequentially laminated with the electrode layer 102 being at the bottom.

It should be noted that, for the sake of clarity, the accompanying drawings do not illustrate all of the structures of the array substrate 200. In order to realize indispensable functions of the array substrate, those skilled in the art may provide other structures, which are not illustrated in the accompanying drawings, according to specific implementations, and no specific limitation will be given to the embodiments of the present disclosure.

In the array substrate 200 provided by the present embodiment, by providing the groove 105 on the surface of the electrode layer 102 facing the first organic functional layer 103, the first organic functional layer 103 on the electrode layer 102 forms the fracture opening 104 at the groove 105. The fracture opening 104 allows the portions of the first organic functional layer 103 at two sides of the fracture opening 104 to be separated, such that the lateral transportation of the carriers of the first organic functional layer 103 between adjacent sub-pixels may be blocked. The array substrate 200 can alleviate undesired phenomenon such as the cross-color and reduction in contrast ratio of the display panel and improves the display effect of the display panel. Meanwhile, the array substrate 200 also in favor of increasing the thickness of the first organic functional layer 103, such that the life span of the organic light emitting element 100 may be prolonged.

For example, an example of the present disclosure further provides a display panel and an electronic device including the display panel. The display panel comprises any one of the array substrates described in the above-mentioned embodiments. The display panel, for example, may be an organic light emitting diode display panel. The electronic device, for example, may be any product or component which includes the display panel and has a display function, such as a tablet, a laptop, a camera, and a navigator. The technical effect of the display panel and the electronic device may refer to the technical effect of the array substrate described in the above-mentioned embodiments, and no further description will be given here.

Another embodiment of the present disclosure provides a manufacturing method of an array substrate, FIG. 5A-FIG. 5E are schematic cross-sectional structural views of the array substrate 200 in fabrication processes.

Figure 5A:
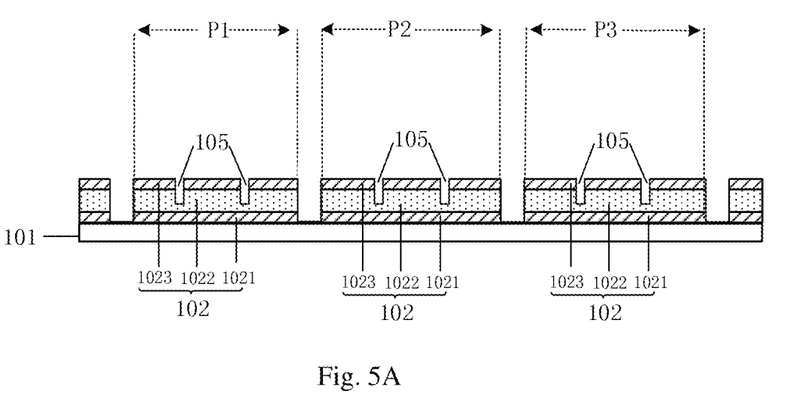
FIG. 5A-FIG. 5E are schematic cross-sectional structural views of an array substrate, in manufacturing process, provided by an embodiment of the present disclosure.

For example, as illustrated in FIG. 5A, firstly, a base substrate 101 is provided, and the base substrate 101, for example, may be a glass substrate, a quartz substrate, a plastic substrate or any other substrate with a suitable material. For example, in an example, the base substrate 101 may also be a flexible base substrate, and the flexible base substrate 101, for example, is a bendable transparent substrate.

For example, as illustrated in FIG. 5A, a film for a first sub-electrode layer, a film for a second sub-electrode layer, and a film for a third sub-electrode layer are sequentially deposited on the base substrate through methods such as a chemical vapor deposition method or a physical vapor deposition method. A photoresist layer is formed on the entire surface of the film for the third sub-electrode layer, and the photoresist layer is patterned through photolithography processes including an exposure process and a development process, so as to form a photoresist pattern with a desired shape on the film for the third sub-electrode layer. The film for the first sub-electrode layer, the film for the second sub-electrode layer, the film for the third sub-electrode layer are simultaneously patterned through using the photoresist pattern as an etching mask, so as to form a first sub-electrode layer 1021, a second sub-electrode layer 1022 and a third sub-electrode layer 1023 on the base substrate 101, such that an electrode layer 102 is formed. The electrode layer 102 is formed in each of the sub-pixels of the array substrate 200, and the electrode layers 102 in adjacent sub-pixels are spaced apart from each other through a pixel definition layer 111. In the present embodiment, examples of the material the first sub-electrode layer 1021 and the third sub-electrode layer 1023 comprises transparent conductive oxide, and the transparent conductive oxide, for example, is indium zinc oxide (IZO) or indium tin oxide (ITO); examples of the materials of the second sub-electrode layer 1022 comprises a metal material, and the metal material, for example, comprises silver, copper, aluminum, chromium, molybdenum, titanium, silver alloy, copper alloy, aluminum neodymium alloy, copper-molybdenum alloy, molybdenum-tantalum alloy, molybdenum-neodymium alloy or any combination of the above-mentioned metal materials. No specific limitation will be given in the present embodiment.

For example, as illustrated in FIG. 5A, the surface of the electrode layer 102 away from the base substrate 101 is formed with a groove 105, and the groove 105 penetrates at least one sub-electrode layer at the side, which is away from the base substrate 101, of the electrode layer 102. For example, as illustrated in FIG. 5A, the groove 105 penetrates the third sub-electrode layer 1023 and part of the second sub-electrode layer 1022. For example, by controlling parameters such as etching speed and etching time, the groove 105 is allowed to penetrate the third sub-electrode layer 1023 and part of the second sub-electrode layer 1022, the portion, which is located at the groove 105 and is not etched, of the second sub-electrode layer 1022, for example, may serve as a reflective anode. In a direction parallel to the array substrate 200, the groove 105 is formed at the periphery portion of the electrode layer 102 and extend along the edge of the electrode layer 102, and the planar shape of the groove 105 may adopt any suitable shape such as a ring-shape or a stripe-shape, the ring-shape may be an enclosed ring-shape or unenclosed ring-shape, no specific limitation will be given to the present embodiment regarding the planar shape of the groove 105. For example, in a direction parallel to the array substrate 200, the groove 104 surrounds the periphery of the electrode layer 102, and is close to the edge of the electrode layer 102, so as to allow the first organic functional layer 103 formed on the electrode layer 102 in subsequent processes to be fractured at the groove 105, and allow the lateral transportation of the carriers of the first organic functional layer 103 between adjacent sub-pixels to be blocked. For example, in an example, the planar shape of the groove 105 is an enclosed ring-shape, and the enclosed ring-shape may be any suitable shape such as a square ring, a rectangular ring, a circular ring, a polygon ring, and no limitation will be given to the present embodiment in this respect. For example, refer to FIG. 4A and FIG. 5A, the width W of the groove 105 in the direction perpendicular to the extension direction of the groove 105 is about in a range from 1 μm to 5 μm, but the present embodiment is not limited to this case. For example, as illustrated in FIG. 5A, the depth of the groove 105 in the direction perpendicular to the base substrate 101 is greater than the thickness of the first organic functional layer 103, which is formed in a subsequent process, in the direction perpendicular to the base substrate 101. For example, in an example, the depth of the groove 105 in the direction perpendicular to the base substrate 101 is about in a range from 20 nm to 90 nm, but the present embodiment is not limited to this case. For example, the depth of the groove 105 may allow the first organic functional layer 103, which is formed in a subsequent process, to be fractured at the groove 105 and allow subsequent film layers on the first organic functional layer 103 to be not fractured at the position corresponding to the groove 105.

Figure 5B:
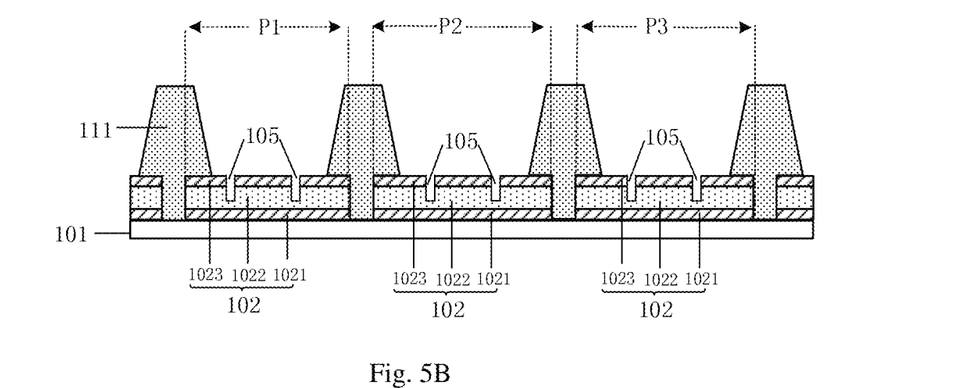

For example, as illustrated in FIG. 5B, a film for the pixel definition layer is formed on the base substrate 101 formed with the electrode layer 102, the film for the pixel definition layer is patterned through processes such as an exposure process and a development process, so as to form the pixel definition layer 111 on the base substrate 101. The pixel definition layer 111 is configured to define the display area of the array substrate 200, so as to form a plurality of sub-pixels, which are arranged in an array, in the array substrate 200. For example, FIG. 5B illustrates a first sub-pixel P1, a second sub-pixel P2 and a third sub-pixel P3, which are defined by the pixel definition layer 111 and adjacent to each other, and the three sub-pixels, for example, may form one of the pixels of the array substrate 200. For example, examples of the material of the pixel definition layer 111 comprises organic insulation materials or inorganic insulation materials, the organic insulation material, for example, comprises one or more of polyimide, polyamide, acrylic resin, phenolic resin, and no specific limitation will be given in the present embodiment in this respect.

Figure 5C:
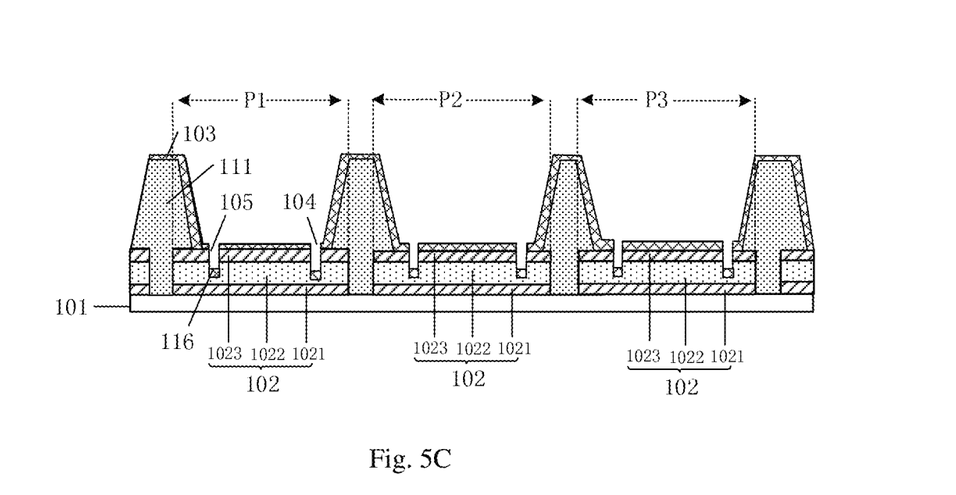

For example, after the electrode layer 102 and the pixel definition layer 111 are formed on the base substrate 101, as illustrated in FIG. 5C, for example, a first organic functional layer 103 may be formed on the electrode layer 102 through an evaporation method. For example, a mask for evaporation is normally needed in forming a film through an evaporation method, and the mask for evaporation normally comprises an opening region of the mask and a shielding region of the mask. The evaporation material for forming the first organic functional layer 103 are deposited on the base substrate 101 through the opening region of the mask for evaporation, so as to form the first organic functional layer 103 on the electrode layer 102 and at the region between adjacent sub-pixels. Because the surface of the electrode layer 102 facing the first organic functional layer 103 comprises the groove 105, and the depth of the groove 105 in the direction perpendicular to the base substrate 101 is greater than the thickness of the first organic functional layer 103 in the direction perpendicular to the base substrate 101, during forming the first organic functional layer 103 through an evaporation method, part of the evaporation material 116 (the material for forming the first organic functional layer 103) is deposited at the bottom of the groove 105, so as to allow a fracture opening 104 is formed at the groove 105, and allow the portions, which are at two sides of the fracture opening 104, of the first organic functional layer 103 to be separated, such that the horizontal transportation, between adjacent sub-pixels, of the carriers of the first organic functional layer 103 is blocked. For example, the first organic functional layer 103 is a hole injection layer, and the hole injection layer 103 comprises a hole injection material, and the hole injection material, for example, comprises at least one of copper phthalocyanine and polyaniline, and no specific limitation will be given in the present embodiment in this respect.

Figure 5D:
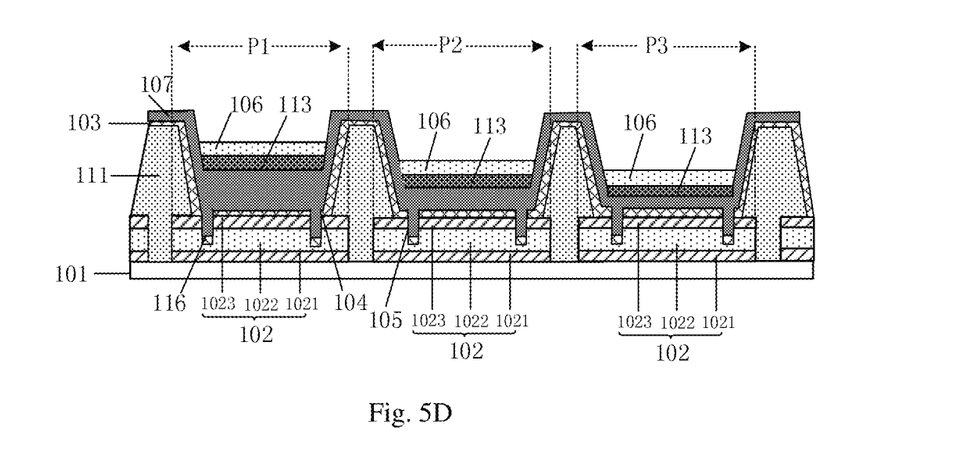

For example, as illustrated in FIG. 5D, structures such as a second organic functional layer 107, an electron blocking layer 113 and a light-emitting layer 106 may be sequentially formed on the first organic functional layer 103 through an evaporation method.

Figure 7:
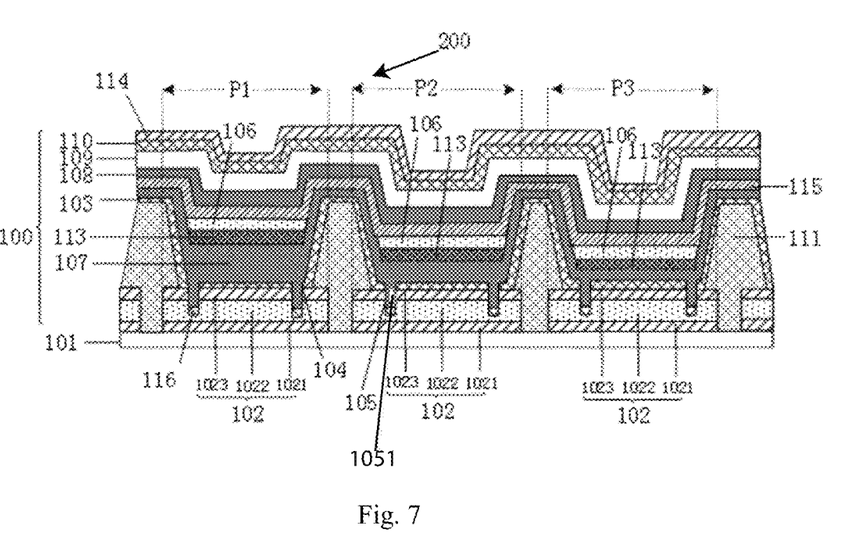
FIG. 7 is a diagram illustrating cross-sectional structure of an array substrate provided by an embodiment of the present disclosure.

For example, as illustrated in FIG. 5D, the second organic functional layer 107, for example, may be a hole transport layer. Because the depth of the groove 105 is greater than the thickness of the hole injection layer 103, the material 116 of the hole injection layer in the groove 105 is formed at the bottom of the groove 105 and is unable to completely fill the groove 105. For example, during forming the hole transport layer 107 on the hole injection layer 103 through an evaporation, part of the hole transport layer 107 may also be formed in the groove 105 and is on the material 116 of the hole injection layer in the groove. For example, the hole transport layer 107 is continuously distributed at the groove 105. For example, the hole transport layer 107 is a continuous film layers which is on the hole injection layer 103 and at the region between adjacent sub-pixels. For example, the mobility of the carriers of the formed hole injection layer 103 is greater than the mobility of the carriers of the hole transport layer 107. Each of the sub-pixels of the array substrate 200 is formed with the light-emitting layer 106, the light-emitting layers 106 in adjacent sub-pixels are spaced apart from each other. For example, as illustrated in FIG. 5D, the color of the light emitted by the light-emitting layer 106 in the first sub-pixel P1, the color of the light emitted by the light-emitting layer 106 in the second sub-pixel P2, and the color of the light emitted by the light-emitting layer 106 in the third sub-pixel P3 may be the same or different. For example, in an example, the light-emitting layer 106 in the first sub-pixel P1 is a red light-emitting layer, the light-emitting layer 106 in the second sub-pixel P2 is a green light-emitting layer, and the light-emitting layer 106 in the third sub-pixel P3 is a the blue light-emitting layer, such that the display panel including the array substrate 200 can realize color display. As illustrated in FIG. 5D, the groove 105 is filled with the materials for forming the first and second organic functional layers, but the embodiments of the disclosure are not limited thereto. For example, a void 1051 may be formed in the groove, as illustrated in FIG. 7.

Figure 5E:
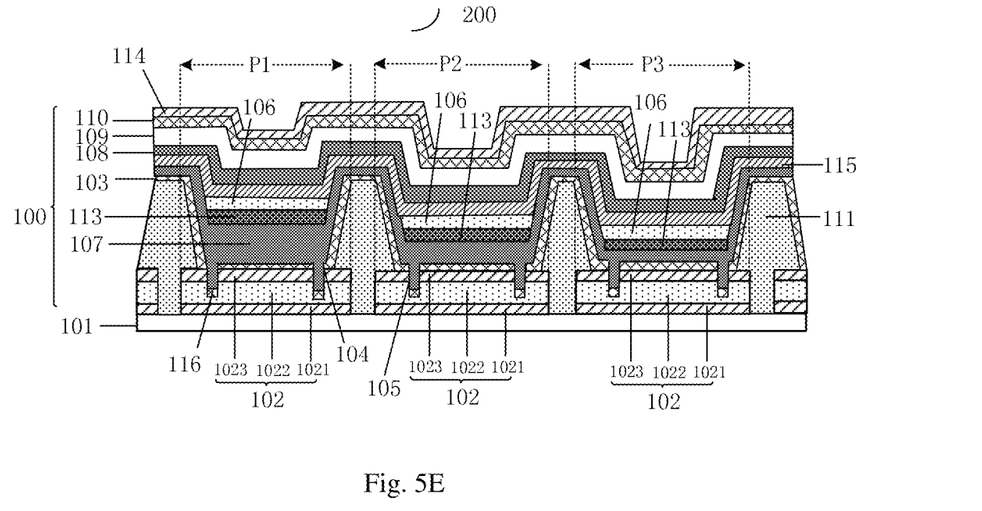

For example, as illustrated in FIG. 5E, structures such as an electron transport layer 108, an electron injection layer 109, an opposed electrode 110 may be sequentially formed on the light-emitting layer 106. For example, in an example, the electron transport layer 108 and the electron injection layer 109 may be formed through an evaporation method, and the opposed electrode 110 may be formed through a chemical vapor deposition method. The electron transport layer 108 and the electron injection layer 109 may be formed from a conventional or known material, and no further description will be given to the present embodiment here. In the present embodiment, the electrode layer 102 is the anode of the organic light emitting element 100, the opposed electrode 110 is the cathode of the organic light emitting element 100, and an exciton is formed in the light-emitting layer 106 through combination of the hole injected from the anode 102 and the electron injected from the cathode 110, so as to allow the light-emitting layer 106 to emit light.

For example, as illustrated in FIG. 5E, in another example, structures such as a hole blocking layer 113, an optical adjustment layer 114 and an electron blocking layer 115 may also be formed on the base substrate 101 formed with the light-emitting layer 106. For example, the hole blocking layer 113 is formed between the hole transport layer 107 and the light-emitting layer 106, and the electron blocking layer 115 is formed between the electron transport layer 108 and the light-emitting layer 106.

It should be noted that, no limitation is given in the present embodiment regarding the forming method of the electrode layer 102. For example, in another example, the electrode layer 102 may also be formed through another manufacturing method. For example, as illustrated in FIG.

Figure 6A:
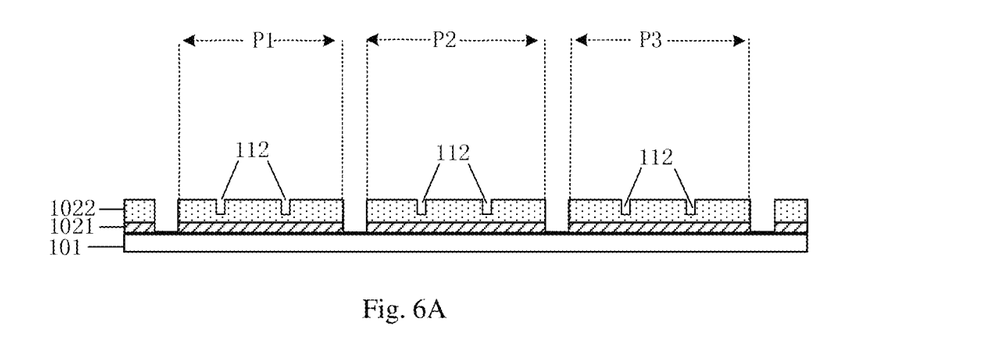
FIG. 6A-FIG. 6B are other schematic cross-sectional structural views of the array substrate, in manufacturing process, provided by an embodiment of the present disclosure

6A, firstly, the base substrate 101 is provided, and the base substrate 101, for example, may be a glass substrate, a quartz substrate, a plastic substrate or any other substrate with a suitable material. For example, in an example, the base substrate 101 may also be a flexible base substrate, and the flexible base substrate 101, for example, is a bendable transparent substrate. As illustrated in FIG. 6A, the film for the first sub-electrode layer and the film for the second sub-electrode layer are sequentially formed on the base substrate 101 through methods such as a chemical vapor deposition method or a physical vapor deposition method, and the film for the first sub-electrode layer and the film for the second sub-electrode layer are simultaneously patterned through photolithography processes, so as to form the first sub-electrode layer 1021 and the second sub-electrode layer 1022 on the base substrate 101, and a recessed portion 112 which at least penetrates the second sub-electrode layer 1022 is formed on the surface of the second sub-electrode layer 1022.

Figure 6B:
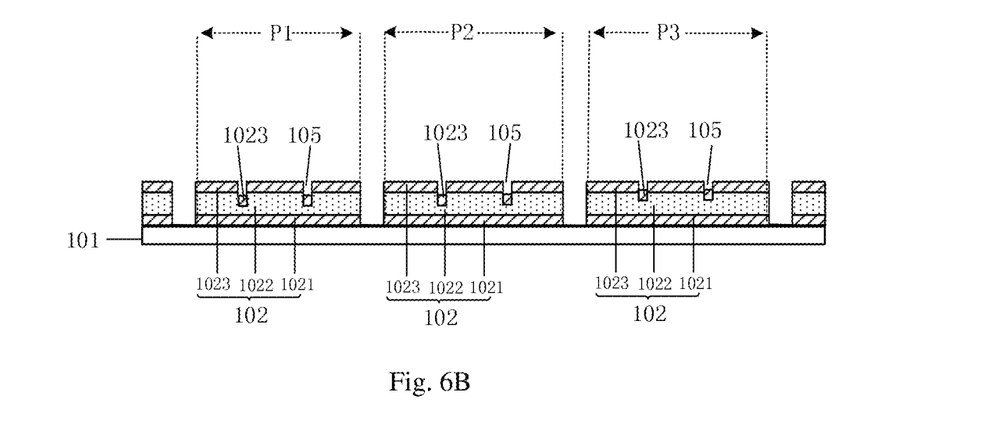

For example, as illustrated in FIG. 6B, a film for a third sub-electrode layer is deposited on the base substrate 101 formed with the first sub-electrode layer 1021 and the second sub-electrode layer 1022, and the third sub-electrode layer 1023 is formed through patterning the film for the third sub-electrode layer. Part of the material for forming the third sub-electrode layer 1023 is formed in the recessed portion 112, so that the third sub-electrode layer 1023 forms a fracture opening at the recessed portion 112, and the recessed portion 112 and the fracture opening of the third sub-electrode layer 1023 form the groove 105. After the groove 105 is formed in the electrode layer 102 according to the embodiments illustrated in FIG. 6B, the subsequent processes for forming the array substrate may be conducted according to the method as illustrated in FIG. 5B-FIG. 5E, so as to finish the fabrication of the array substrate.

In the manufacturing method of the array substrate 200 provided by the present embodiment, by forming the groove 105 on the surface, which faces the first organic functional layer 103, of the electrode layer 102, the first organic functional layer 103 on the electrode layer 102 forms the fracture opening 104 at the groove 105. The fracture opening 104 separates the portions of the first organic functional layer 103 at two sides of the fracture opening 104, so as to block the lateral transportation of the carriers of the first organic functional layer 103 between adjacent sub-pixels. The array substrate 200 can alleviate undesired phenomenon such as the cross-color and reduction in contrast ratio of the display panel and can improve the display effect of the display panel. Meanwhile, the array substrate 200 also in favor of increasing the thickness of the first organic functional layer 103 and prolonging the life span of the organic light emitting element 100.

Although the above embodiments are described in connection with examples that the facture opening is located directly above the first electrode, the embodiments of the disclosure are not limited thereto. For example, at least one embodiment provides an array substrate comprising a base substrate which includes a plurality of sub-pixel regions and inter-sub-pixel regions between adjacent sub-pixel regions; and a first organic functional layer on the base substrate. At least a portion of the first organic functional layer is in the plurality of sub-pixel regions, and the first organic functional layer comprises at least one fracture opening configured to block a transportation of the carriers between adjacent sub-pixel regions.

In some examples, the first organic functional layer is further in the inter-sub-pixel regions, and a part of the first organic functional layer in the inter-sub-pixel regions is a continuous layer, and the part of the first organic functional layer is integral with another part of the first organic functional layer in the sub-pixel regions.

The following statements should be noted:

(1) Unless otherwise defined, in the embodiments of the present disclosure and the accompany drawings, same one character reference represents same one meaning.

(2) The accompanying drawings involve only the structure(s) in connection with the embodiment(s) of the present disclosure, and other structure(s) may be referred to common design(s).

(3) For the purpose of clarity only, in accompanying drawings for illustrating the embodiment(s) of the present disclosure, the thickness and size of a layer or a structure may be enlarged. However, it should understood that, in the case in which a component or element such as a layer, film, area, substrate or the like is referred to be "on" or "under" another component or element, it may be directly on or under the another component or element or a component or element is interposed therebetween.

What are described above is related to the illustrative embodiments of the disclosure only and not limitative to the scope of the disclosure; with the technical content disclosed by the present disclosure, those skilled in the art can easily envisage modifications or substitutions, which should be covered by the scope of the present invention. Therefore, the scopes of the disclosure are defined by the accompanying claims.

What is claimed is:

1. An array substrate, comprising:
a base substrate, comprising a plurality of sub-pixel regions and inter-sub-pixel regions between adjacent sub-pixel regions; and
a first organic functional layer on the base substrate;
wherein at least a portion of the first organic functional layer is in the plurality of sub-pixel regions; and
the first organic functional layer comprises at least one fracture opening, the at least one fracture opening is configured to block a transportation of the carriers between adjacent sub-pixel regions,
wherein an organic light emitting element is provided in each of the sub-pixel regions; and the organic light emitting element comprises: an electrode layer on the base substrate, the electrode layers of adjacent sub-pixels are spaced apart from each other,
the first organic functional layer is provided at a side of the electrode layer away from the base substrate in the sub-pixel regions and in the inter-sub-pixel regions,
the fracture opening is located in the sub-pixel regions, a surface of the electrode layer comprises a groove and the fracture opening and the groove are communicated with each other.

2. The array substrate according to claim 1, wherein the first organic functional layer is further in the inter-sub-pixel regions, and a part of the first organic functional layer in the inter-sub-pixel regions is a continuous layer, and the part of the first organic functional layer is integral with another part of the first organic functional layer in the sub-pixel regions.

3. The array substrate according to claim 1, wherein, an orthographic projection of the groove on the base substrate coincide with an orthographic projection of the at least one fracture opening on the base substrate.

4. The array substrate according to claim 3, wherein an orthographic projection of the groove on the base substrate comprises a ring-shape or a stripe-shape.

5. The array substrate according to claim 4, wherein the ring-shape comprises an enclosed ring-shape.

6. The array substrate according to claim 3, wherein a width of the groove in a direction perpendicular to an extending direction of the groove is in a range from 1 micron to 5 microns.

7. The array substrate according to claim 3, wherein a bottom of the groove comprises a material layer, the material layer has a same material as that of the first organic functional layer, and the material layer is spaced apart from the portions of the first organic functional layer at two sides of the fracture opening.

8. The array substrate according to claim 3, wherein a void is provided in the groove.

9. The array substrate according to claim 3, wherein a depth of the groove in a direction perpendicular to the base substrate is greater than a thickness of the first organic functional layer in the direction perpendicular to the base substrate.

10. The array substrate according to claim 3, further comprising a second organic functional layer, wherein the second organic functional layer is formed at a side of the first organic functional layer away from the electrode layer and is continuously distributed at the groove; and the first organic functional layer has a carrier mobility greater than that of the second organic functional layer.

11. The array substrate according to claim 10, wherein the first organic functional layer and the second organic functional layer are shared by the plurality of sub-pixels.

12. The array substrate according to claim 1, wherein the organic light emitting element further comprises a light-emitting layer at a side of the second organic functional layer away from the first organic functional layer, and an opposed electrode layer at a side of the light-emitting layer away from the second organic functional layer.

13. The array substrate according to claim 12, wherein the light-emitting layers of adjacent sub-pixels are spaced apart from each other.

14. The array substrate according to claim 1, wherein the first organic functional layer comprises a hole injection layer.

15. A display panel, comprising the array substrate according to claim 1.

* * * * *